United States Patent [19]

Arnold et al.

[11] 4,024,523

[45] May 17, 1977

[54] BATTERY CONDITION MONITORING METHOD AND APPARATUS

[75] Inventors: John B. Arnold, Seville; John M. Bowyer, Copley; Howard R. Hegbar; Archie B. Shaefer, both of Akron, all of Ohio

[73] Assignee: Goodyear Aerospace Corporation, Akron, Ohio

[22] Filed: Oct. 14, 1975

[21] Appl. No.: 622,201

[52] U.S. Cl. .................................. 340/249; 320/48
[51] Int. Cl.² ................................. G08B 21/00
[58] Field of Search ........... 340/249, 248 B, 253 C; 324/29.5; 320/48; 307/10 BP

[56] References Cited

UNITED STATES PATENTS

| | | | |
|---|---|---|---|
| 3,614,734 | 10/1971 | Davis | 340/249 X |
| 3,621,359 | 11/1971 | Schnegg | 340/249 X |

*Primary Examiner*—John W. Caldwell
*Assistant Examiner*—Daniel Myer
*Attorney, Agent, or Firm*—Oldham & Oldham

[57] ABSTRACT

A battery condition monitoring device which senses battery terminal voltage and creates a function thereof and tests that function against predetermined criteria and determines battery condition as a result of such tests. Further, the invention operates on the transient of the battery terminal voltage existant immediately upon the loading of the battery. The test is performed on the slope of the terminal voltage transient and a function of that transient during a test period is created, analyzed and evaluated against reference levels.

13 Claims, 8 Drawing Figures

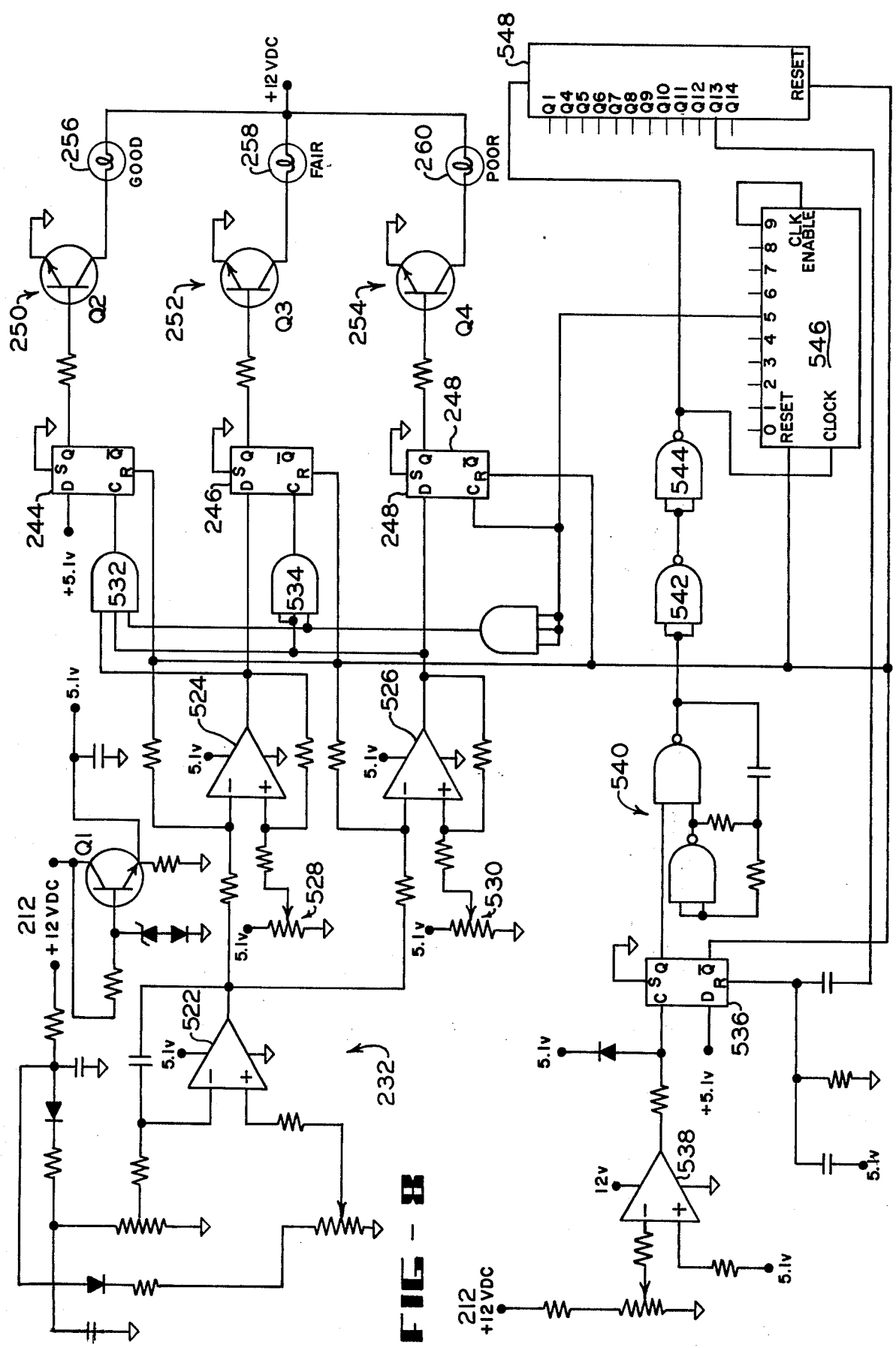

BATTERY CONDITION MONITORING METHOD AND APPARATUS

BACKGROUND OF THE INVENTION

Wet cell rechargeable batteries or secondary batteries such as lead-acid, silver-cadmium, nickel-cadmium, and silver-zinc deteriorate with age and usage because the plates shed active material and are chemically and mechanically altered during the charge-discharge cycles of normal operation. Such gradual deterioration ultimately results in a device that no longer can retain a useful charge of sufficient capacity to carry its normal load. The inconvenience of sudden and unanticipated battery failure is well known to operators of automobiles, aircraft, industrial traction trucks, and military vehicles. A battery-condition monitor that indicates the state of deterioration and which is capable of signalling the approaching end of useful life provides a useful expedient to the users of equipment dependent upon the proper operation of associated rechargeable batteries.

Heretofore, numerous approaches have been taken to provide a device capable of indicating the state of deterioration of such batteries. Approaches have been taken wherein a test for the conductivity of the electrodes of the battery is run since such conductivity changes with cycling and charge. Such an approach is set forth in U.S. Pat. No. 2,988,590. Yet other devices have been proposed such as in U.S. Pat. No. 3,065,827 wherein voltage sensitive devices such as relays are provided to actuate charge indication means, such as lights, if the battery voltage is above or below a particular level. A similar approach, utilizing a warning light, is presented in the U.S. Pat. No. 3,118,137, wherein an electronic circuit is connected across the terminals of a battery to continually monitor the terminal voltage thereof and determine the state of the charge remaining in the battery as a function of the terminal voltage. This prior art structure requires a constant monitoring of the battery potential and consequent battery drain along one of two discharge paths.

Many other techniques and devices for the testing of battery conditions have been proposed wherein the specific gravity and/or chemical composition of the battery electrolyte is tested. Such tests are generally complex, inaccurate, and conductive only to a manual rather than automatic mode of operation. Other techniques of electronic analysis of battery condition are proposed in U.S. Pat. Nos. 3,484,681; 3,500,167; 3,503,062; 3,529,230; 3,550,105; and 3,832,629. While these references are of interest for purposes of general prior art concepts, the shortcomings thereof will be readily apparent in view of the embodiments of the instant invention presented herein.

It is an object of the instant invention to present a battery condition monitor for attachment to a vehicle battery and operative to test the condition of such battery at the instant of loading the same. This test, at the instant of loading, is truly a measure of battery capability to service the existing load.

Still another object of the invention is to present a battery condition monitor wherein the transient voltage of the battery, under initial load, is tested and the general condition of the battery is determined thereby.

Yet another object of the invention is to verify subsystem integrity by testing loading situations that may be temporarily serviced by the battery but are detrimental to its service life.

Yet another object of the invention is to present a battery condition monitor wherein a basic testing technique on a lead cell battery is adaptable for any of numerous implementations.

Still a further object of the invention is to provide a battery condition monitor which is inexpensive to construct, reliable in operation, highly accurate in testing, has a low power standby posture, and is conducive to implementation in any of a multitude of systems incorporating rechargeable batteries.

These objects and other objects which will become apparent as the detailed description proceeds are achieved by: A battery condition monitoring device for connection across the terminals of a rechargeable battery comprising: a function generator connected to the battery and producing an output signal as a function of the terminal voltage of the battery; a timing circuit connected between the battery and function generator for establishing a test time period; comparison means connected to said function generator for comparing the value of said function at the end of said test time period with preselected voltage references, the comparisons determining the condition of said battery; and display means connected to said comparison means for indicating the condition of said battery.

DESCRIPTION OF THE DRAWINGS

For a complete understanding of the objects, structure and techniques of the invention, reference should be had to the following detailed description and accompanying drawings wherein:

FIG. 8 is an embodiment of the detailed circuitry of the block diagram of FIG. 5 and the flow chart of FIG. 7.

DETAILED DESCRIPTION OF PREFERRED EMBODIMENTS

A sensitive parameter of battery cell condition is the internal electrical resistance thereof. As a rechargeable battery ages and the plates shed active material, the internal resistance of the device increases from the original value when the battery was new and first placed in service. Measurement of terminal voltage regulation; that is the drop in terminal voltage under load, can yield an evaluation of internal resistance when ambient temperature and the characteristics of the load are properly accounted for. Measuring and evaluating the behavior of internal cell resistance as a function of battery life can yield as assessment of battery condition, aging, and the associated probable remaining life. In automobile and similar applications, and for large variations in ambient temperature and under conditions where a heavy load is applied, it is convenient and appropriate to determine internal battery resistance in the time interval between starter switch contact closing and the instant of starter motor rotation.

In the automobile application, use of the initial current transient period closing following the starter solonoid switch as a test cycle time provides several beneficial features. The monitoring device is only activated when the starter is operated, thus permitting avoidance of any substantial continuing battery drain by the monitoring device. Further, this initial starter current transient is a substantial load of several hundred amperes and the battery is tested near its maximum output. By proper choice of the turn-on and the end-of-test battery terminal voltage levels for circuit triggering, the test cycle can be restricted to the starter transient current period, thus avoiding activation of the monitor circuit by the normal loads of other auto electrical equipment.

Figure 1:
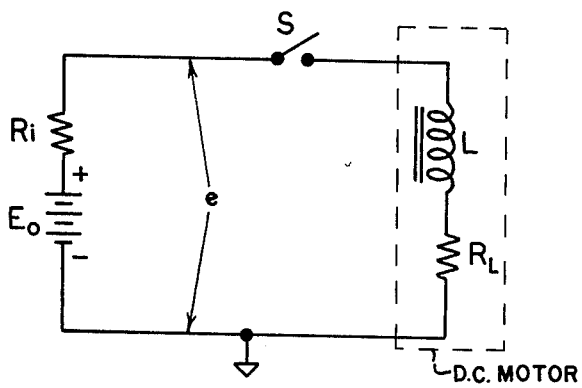
FIG. 1 is a schematic diagram of a battery-powered circuit.

In automotive starting service, traction vehicles such as industrial fork-lift trucks and the like, a common circuit configuration exists which lends itself to the measurement of battery internal resistance under turn-on transient conditions. The configuration consists of a motor load suddenly switched across a battery. For convenience of analysis and discussion, individual cells will be treated as a series connected group comprising a single battery. A simplified and substantially equivalent circuit prior to motor turn on consists of the series connection of a battery of voltage Eo and its internal resistance Rb separated by means of an open switch S (which could represent the starter solonoid switch) from the respective inductance and resistance of the starter motor load L and R1. Such a circuit is shown in FIG. 1. Solving for the instantaneous value of current in terms of the EMF and impedences which exist prior to the time at which the motor rotor just commences to rotate, some insight into the transient behavior of the circuit of FIG. 1 can be had.

Summing for the EMF's about the circuit by use of Kirchoff's Voltage Law:

$$Eo - iRb = iR1 + Ldi/dt$$
$$Eo = i(Rb + R1) + Ldi/dt$$
$$i = [Eo/(Rb + R1)][1 - \exp(-Rb - R1)t/L]$$

where
(exp) = Napierian Logarithm base.

In reference to FIG. 1 it should be apparent that $e = Eo - iRb$. Since Eo is constant as may be assumed for an idealized battery, $e$ varies as a function of current $i$ because of Rb, the apparent internal battery resistance. The regulation under load or drop in terminal voltage is thus:

$$Eo - e = iRb = eb$$

Figure 2:
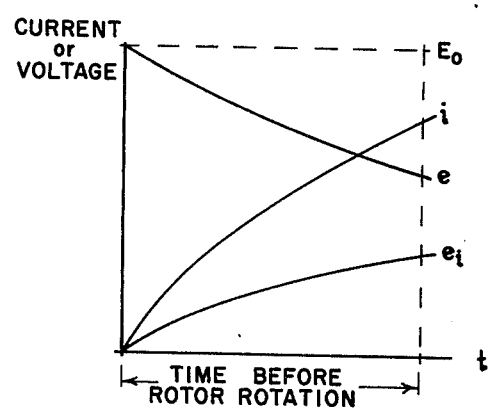
FIG. 2 is a response curve of the circuit parameters of FIG. 1 at the moment the battery is loaded.

The behavior of i, e and eb as a function of time is shown in FIG. 2, although is should be noted that the equations presented hereinabove and the graph of FIG. 2 is only valid for the locked-rotor case; that short time interval prior to rotor movement. When the rotor starts to turn, a back EMF is generated and, in the automobile case, the generator EMF starts to appear on the bus and thus the equations become invalidated by the introduction of these EMF's in addition to Eo.

It should be apparent that a change only in Rb will cause a change in the current $i$, the terminal voltage $e$, and the internal battery drop eb. Measurement of these changes as influenced by Rb and the assessment of the measured values forms a basis for the methods and structures of the inventions presented herein. The apparent internal electrical resistance Rb of a battery has the smallest value when the battery is new, fully charged, and properly filled with electrolyte. The value of Rb will increase due to aging of the battery, lack of charge in one or more cells, and a low level of electrolyte below the top of the cell plates. It should be noted that when the terminal voltage $e$, for the methods to be presented, is measured in the vehicle's circuit and not directly at the battery posts, the cable and cable terminal clamp resistance must be added to Rb. Corroded or high resistance cable terminal clamps can add enough resistance so as to increase the measured Rb to a value that will yield a battery condition assessment below that which actually exists.

The methods and associated structures presented and described herein are intended to operate during the load current transient interval immediately following Turn-On. Although these methods treat the cells of the battery as a serially connected two-terminal group, it should be understood that the principals, methods, and structures are applicable to individual cells taken singly or in any combination.

Further, since direct measurement of the battery current is difficult to achieve since the same involves inserting a current sensitive device or fixed resistor into the circuit, it has been found to be expedient to make voltage measurements at the cell or battery terminals. Therefore, the methods presented hereinbelow utilize the battery terminal voltage as the input to the monitoring device and its circuits. In the methods described for measurement and assessment of Rb and the associated battery condition, the circuits are triggered and activated when the terminal voltage $e$ drops to a preset initial threshold level V1. The time at which this occurs is defined as $t1$. This can be noted from reference to FIG. 3 and will be further discussed hereinafter.

There are presented several methods and structures for achieving the objects of the invention wherein a function of terminal voltage is monitored for a time interval T for the assessment of Rb and the associated battery condition. In each of the methods, a function F(e) of the battery terminal voltage is created by the circuits. F(e) varies in the time period T and at the end thereof F(e) is measured and compared to preset reference values to yield the assessment of Rb and the corresponding battery condition. It will be noted that F(e) is unique for each of the various methods and structures as are the present constant values.

EMBODIMENT I

Figure 3:
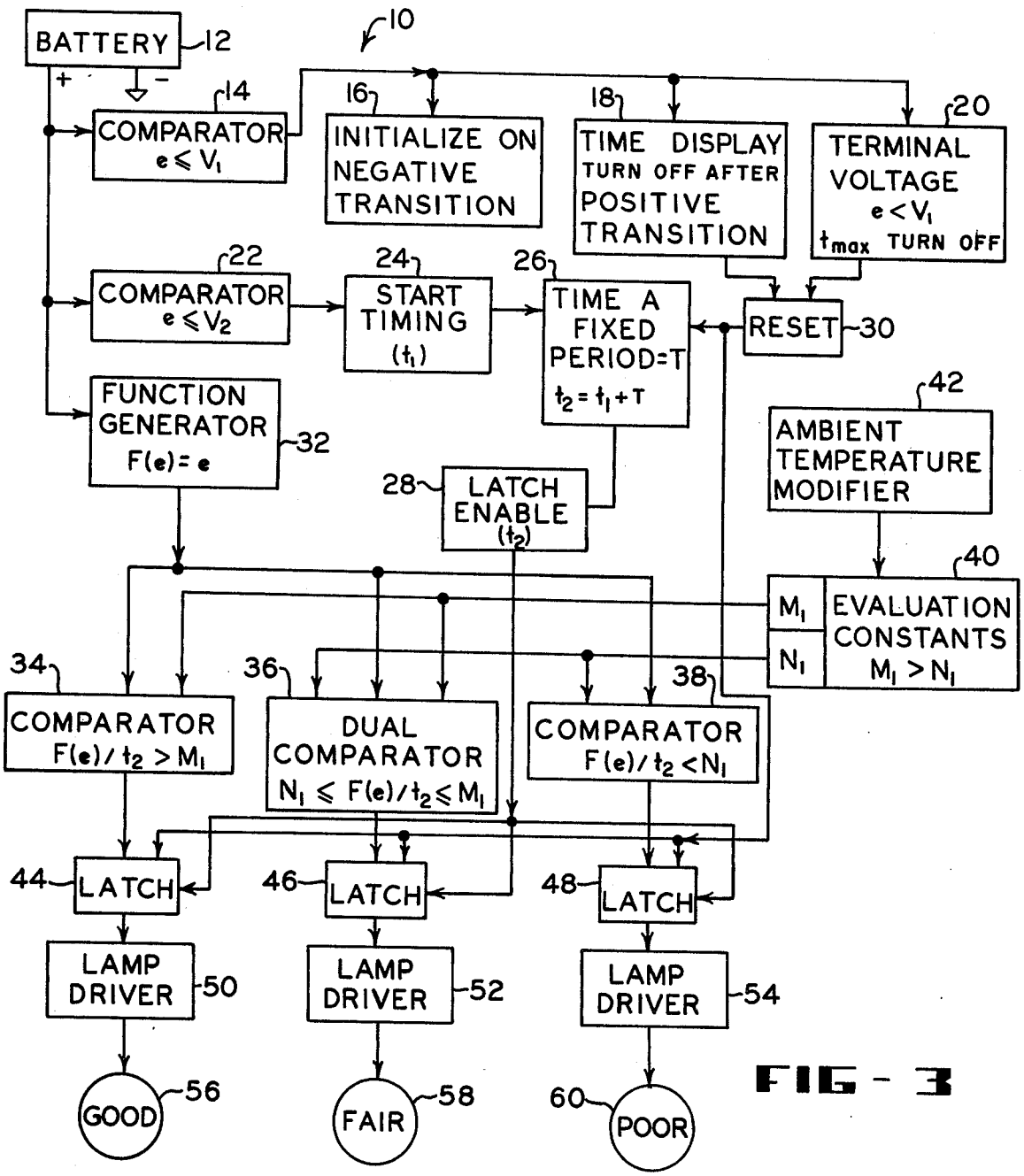
FIG. 3 is a block diagram of the circuitry comprising a first embodiment of the invention.

Referring now to FIG. 3, a block diagram schematic of a preferred embodiment of the invention may be seen as designated generally by the numeral 10. Here, a battery 12 is connected to a comparator 14 which is operative to compare the output of the battery 12 against a preselected voltage level V1. The output of the comparator 14 is connected to an initialization circuit 16 which, upon sensing the dropping of the terminal voltage below the value V1, is operative to initialize the testing circuit. A circuit 18 is also connected to the comparator 14 and is operative, upon the positive transition of the battery terminal transient, occurring after removal of the load, to reset certain of the testing circuitry. Yet further connected to the comparator 14 is a circuit 20 which, similar to the circuit 18, is functional to cause the resetting of certain of the test circuit elements if the battery terminal voltage $e$ remains less than the reference voltage V1 in excess of a preselected time period.

Further connected to the terminal of the battery 12 and monitoring the voltage thereof is a comparator 22 which is connected to a timing circuit 24 and operative to start a test time interval upon the transition of the battery terminal voltage below a second voltage level V2. The timing circuit 24 continues to count for a preselected period of time T as fixed and monitored by the circuit 26. Of course, the circuit 26 may be readily conceived by one skilled in the art to be a counter having a decoded output operative to present an output signal when the counter has counted the T time period.

A function generator 32 receives the output of the battery 12 and creates a voltage function thereof. In the particular embodiment under consideration, this function is the terminal voltage $e$ itself. This voltage function is applied to a plurality of comparators 34-38 which also receive evaluation constants M1 and N1 as supplied via the circuit 40. Of course, the circuit 40 may comprise nothing more than a voltage divider network. The evaluation constants 40 are each supplied to two of the comparators 34-38 with the larger constants being supplied to the comparators 34, 36 while the smaller constant is supplied to the comparators 36, 38. The comparators are such that an output is presented from the comparator 34 if the voltage function from the generator 32 is greater than the larger of the evaluation constants; an output is emitted from the comparator 38 if the function from the generator 32 is less than the smaller of the evaluation constants; and an output is emitted from the comparator 36 if the function from the generator 32 falls between the two evaluation constant levels.

At the end of the test period as designated by the output of the circuit 26, a latch enable signal 28 is created designating the time $t2$, the beginning of the timing cycle being designated by the time $t1$. At the end of such test cycle, an output from the latch enable circuit 28 is applied to the plurality of latches 34-48 to enable the same to receive the outputs of the comparators 34-38. Of course, at any particular point in time there is an output from only one of the comparators 34-38 and it is the output of that comparator which is operative to actuate the associated latch 44-48 at the time $t2$ as dictated by the output of the latch enable circuit 28. With the latch so actuated, the associated lamp driver 50-54 is gated on so as to drive the appropriate signal means or lamps 56-60. It should now of course be readily apparent that the outputs of the comparators 34-38 at the time $t2$ are indicative of the grade of the battery 12. Thus, the lamps 56-60 are accordingly graded so as to relate that the battery is in good, fair or poor condition.

It should be briefly noted that an ambient temperature modifier 42 may be included with the circuitry to compensate for temperature changes and accordingly regulate the outputs of the circuits 40. Of course, the circuit 42 could most likely include a diode arrangement as is well known in the art.

The latches 44-48 are reset at the end of the test cycle as determined by the outputs of the circuits 18, 20 by means of the reset circuit 30. Thus, the circuitry of the invention presents a load on the battery 12 only during the testing cycle and display period. In the embodiment shown, the lamps 56-60 are operative to turn off via the circuit 18 when the battery voltage exceeds the value V1 on the positive transistion of the terminal transient.

EMBODIMENT II

Figure 4:
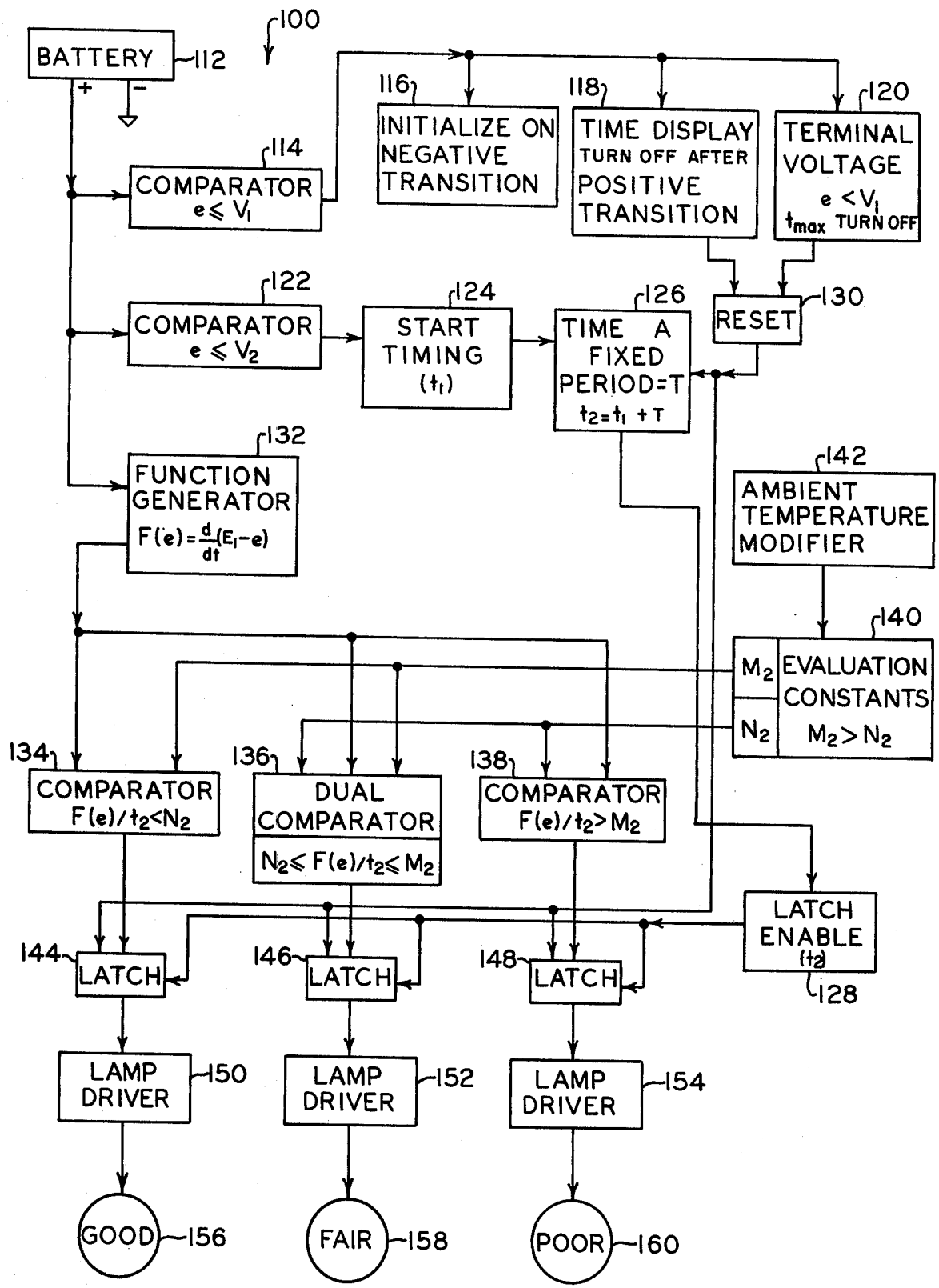
FIG. 4 is a block diagram of the circuitry comprising a second embodiment of the invention.

With reference now to FIG. 4, there is shown a second embodiment, designated generally by the numeral 100, which is functional to perform the techniques of the invention. The structure of this embodiment is quite similar to that related to Embodiment I with corresponding circuit elements of FIG. 4 being designated by numerals increased by 100 over the corresponding elements of FIG. 3. It should be briefly noted that in this embodiment the function generator 132 creates a voltage function which is the first derivative with respect to time of the deviation of the battery terminal voltage $e$ from a fixed reference level E1. As a consequence, a good battery will result in the function being less than the smaller evaluation constant supplied from the circuit 140 while a poor battery will be evidenced by the value of the function exceeding the larger of the evaluating constants. Again, a fair battery will fall between the values of the outputs of the evaluation constant generator 140.

EMBODIMENT III

Figure 5:
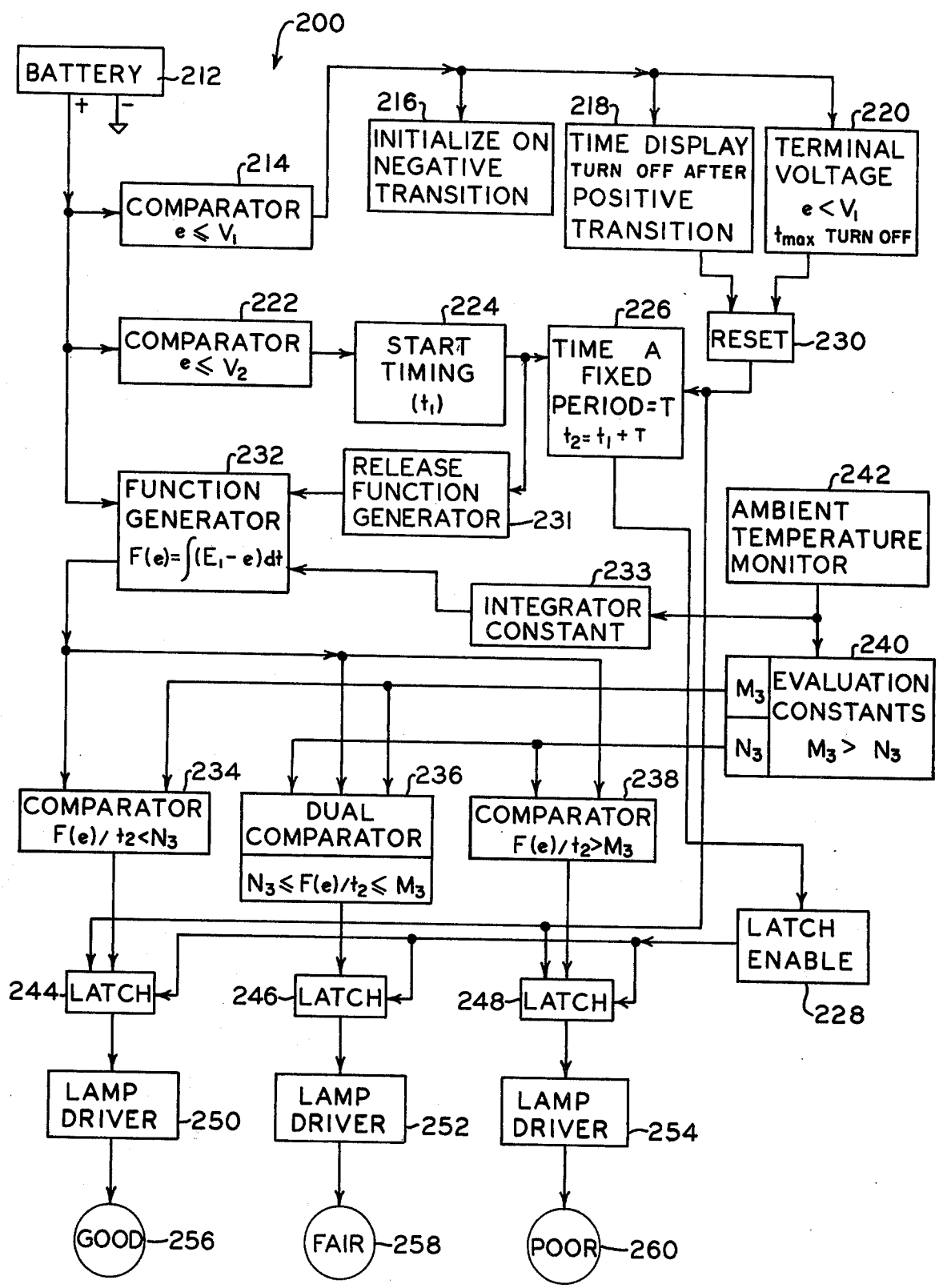
FIG. 5 is a block diagram of the circuitry comprising a third embodiment of the invention.

The circuit 200 depicted in FIG. 5 is yet a further embodiment of the instant invention and comprises a slight variation on the basic theme thereof. Here again, the elements are substantially the same as shown in the embodiment of FIG. 3 with the corresponding elements being designated by numerals increased by 200. It should be noted in this embodiment that the function generator 232 creates a time based integral of the deviation of the battery terminal voltage $e$ from a preselected level E1. With the function of this embodiment being an integral, an integrator constant 233 is supplied thereto; this constant again being temperature compensated by the ambient temperature monitor 242. Again, since the function generator 232 comprises an integrator circuit, it is important that the circuit function be started at the time $t1$ such that the integral will be taken over only the time period T. Consequently, the circuit 231 is provided for enabling and releasing the function generator 232 from operation to guarantee that the same operate from the time $t1$ through the end of the test period T. Again, evaluation constants are supplied via 240 to a plurality of comparators 234-238 and, as will be appreciated by one skilled in the art, the function value at time $t2$ will be less than the smaller of the evaluation constants for a good battery, greater than the larger of the evaluation constants for a poor battery, and fall therebetween for a fair battery.

EMBODIMENT IV

Figure 6:
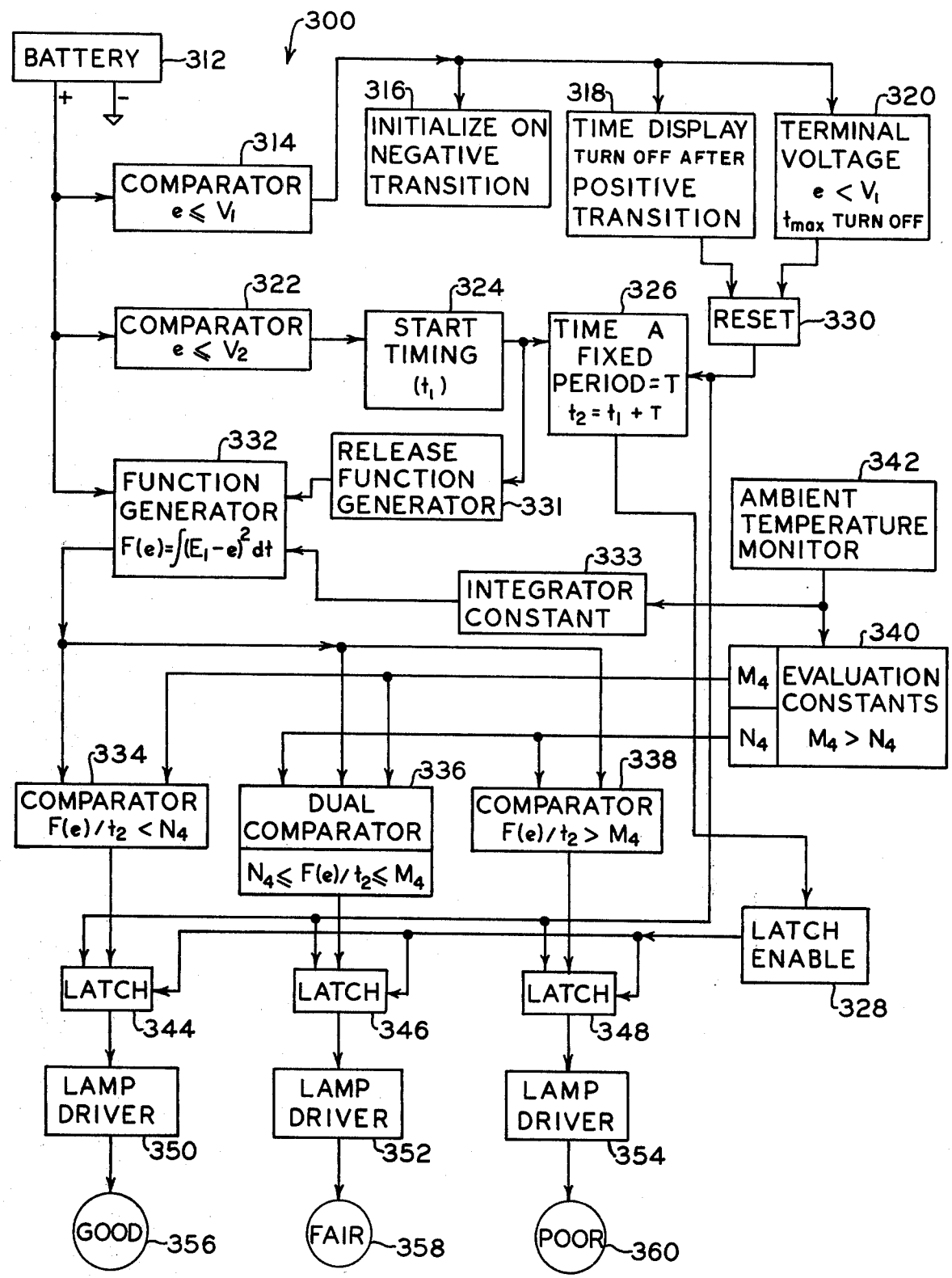
FIG. 6 is a block diagram of the circuitry comprising fourth embodiment of the invention.

With reference to FIG. 6, the last variation on the basic theme of the invention may be seen as designated generally by the numeral 300. Again, circuit elements of this embodiment common with those of Embodiment I share like element designation numerals with such numerals of FIG. 6 being increased by 300. The function generator 332 of the instant invention again provides an integral function of the battery terminal voltage; the function of this embodiment being the integral of the square of the deviation of the battery terminal voltage $e$ from a fixed level E1. The circuits 331 and 333 provided herein are similar to those of Embodiment III and provide for like purposes.

The evaluation of the battery condition with respect to the constants is again similar to that of Embodiment III with a good battery resulting in a value less than the smaller evaluation constant, a poor battery resulting in a value larger than the greater evaluation constant, and a fair battery falling therebetween.

Figure 7:
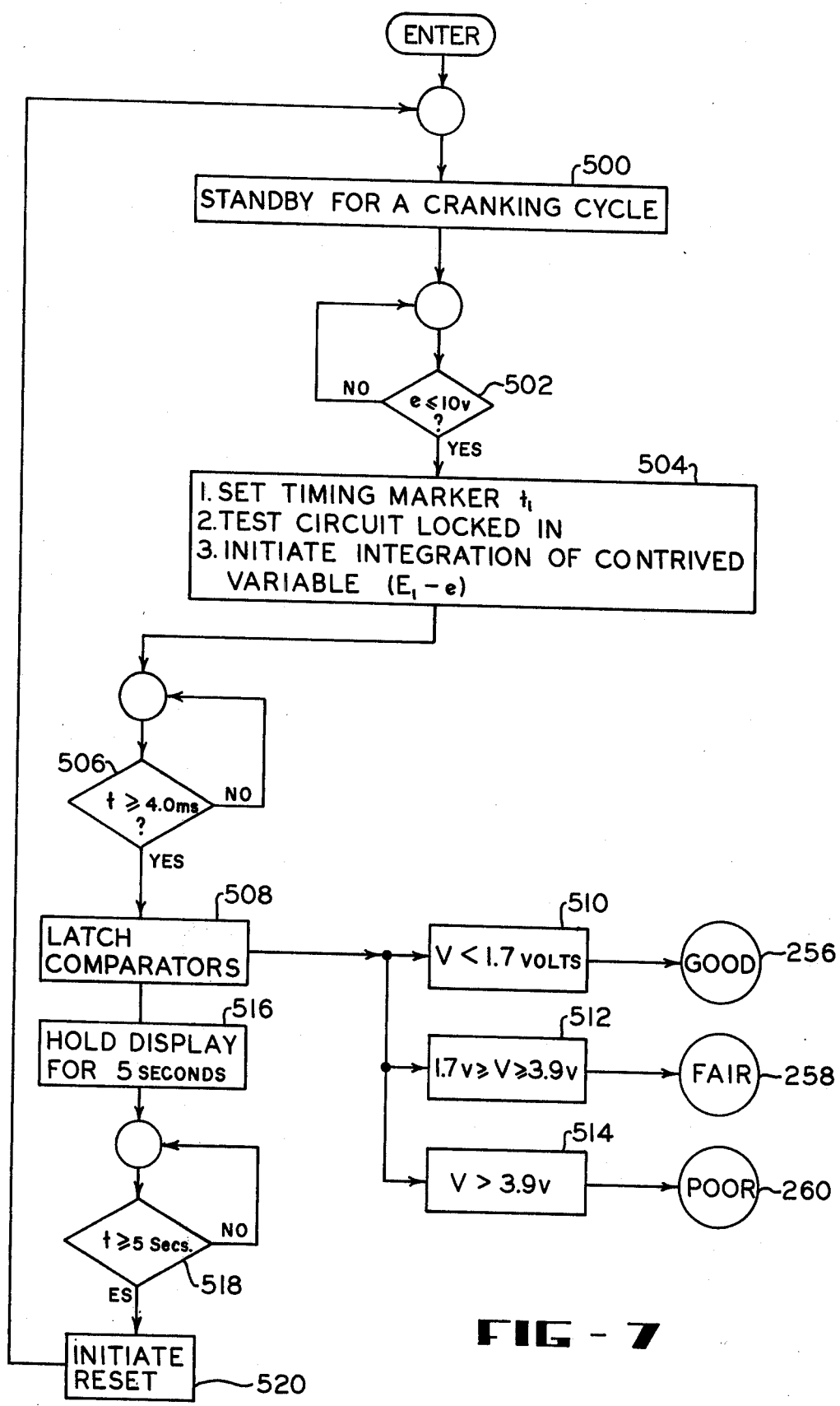
FIG. 7 is a flow chart of the operation of the embodiment of FIG. 5.

With reference now to FIG. 7, there is shown a flow diagram of the circuit operation of Embodiment III as illustrated in FIG. 5. During normal operating periods of the vehicle utilizing the structure of the invention, the system is in the standby mode 500 awaiting a loading or cranking cycle; the battery being loaded by the starter motor. The system waits in the standby mode until the battery voltage e drops to a particular level, for example 10 volts as at 502. When the determination has been made as to the terminal voltage reaching this level, the test time period T is begun by designation of the timing marker $t1$. The test circuit is then locked in and the integration circuitry 232 performs the time based integral function on the contrived variable (E1-$e$). The operation of functional block 504 continues until the decision is made at 506 as to the termination of the test period. As can be noted at 506, in the embodiment shown the test cycle extends for a period of 4.0 milliseconds. At the end of this test cycle, the comparators and their associated latches are actuated as at 508 and determinations are made at 510–514 as to the battery condition. Associated lamp drivers and lamps are then illuminated to evidence the battery conditions.

Provisions are made for maintaining the signal indicia for a period of time sufficient for the operator to apprise himself of the battery condition. At 516 there is provided a five second display period as monitored by decision block 518. The appropriate lamp 256–260 is illuminated for the 5 second interval via 518 at the end of which time the reset cycle 520 is entered into and the test circuit returns to the standby mode 500. Thus, the test system of the invention is operative for but a short period of time and constitutes a power drain which is inconsequential to the battery power source.

Referring now to FIG. 8, a detailed schematic drawing of the Embodiment III is shown. While the specific operation of the discreet components of this schematic should be readily appreciated by one skilled in the art with reference back to FIG. 5, a brief description will be given to facilitate such understanding. The integrator circuit 232, including operational amplifier 522 is connected to the positive terminal of the battery 212. This integrator performs the functions set forth for the function generator of FIG. 5 and provides an output to each of two comparators, 524, 526. The comparator 524 compares the output of the integrator 232 against the lower evaluation constant N3 supplied from the voltage divider 528. Similarly, the comparator 526 compares the output of the integrator 232 against the larger evaluation constant M3 as supplied from the voltage divider 530. The outputs of the comparators 524, 526 are applied via appropriate logic circuitry to the latches 244, 246, 248 which may be D-type flip-flops. The inputs to the flipflops 244, 246 are supplied via the negative input AND/gates 532, 534. It should be readily appreciated that the flipflop 244 will be latched when the output of the integrator 232 is less than both evaluation constants M3 and N3. Such a condition will result in a clocked pulse to the flipflop 244; the data input thereof being tied to a high level. Further, the flipflop 246 will be latched when the data input thereto is at a high level indicating that the output of the integrator 232 is greater than N3 and when a simultaneous clock pulse is present from the AND/gate 534 indicating that the output of comparator 526 relates that the integrator output 232 is less than M3. When the integrator output is greater than M3, there is a high level present on the data input of flipflop 248.

Clocking of the flipflops 244–248 is also dependent upon the termination of the test period T. This test period is initiated via the flipflop 536 when the terminal voltage of the battery 212 has dropped below a particular level as determined by the comparator 538. The output of the flipflop 536 is applied to the oscillator 540 which may be of any suitable nature but is preferably of a 1khz characteristic frequency. These pulses are supplied through the gates 542, 544 to the counter 546. The counter 546 has decoded outputs with the appropriate outputs designating the end of the test period T being operative to drive the clocks of the flipflops 244–248 as shown. Thus, the flipflops are enabled only at the end of the test period T.

The appropriate lamp 256–260 is illuminated via associated lamp driver 250–254 and remains illuminated for a period of time as determined by the counter 548. As can be seen, the clock pulses from the oscilator 540 are also applied to the clock input of the counter 548; the counter being decoded at the five second output and being fed back to the flipflop 536 to reset the same at the end of such period. The output of the flipflop 536 is then operative to reset the various latches 244–248 and other of the remaining circuitry as shown.

It should now, of course, be appreciated that any of numerous circuit configurations may be utilized to change the structure of the various embodiments proposed herein. While in accordance with the patent statutes only the best mode and preferred embodiment of the invention have been presented and described in detail, it is to be understood that the invention is not limited thereto or thereby. Consequently, for an appreciation of the scope and breadth of the invention, reference should be had to the following claims.

We claim:

1. A battery condition monitoring device for testing a rechargeable battery, comprising:
   an external load engageable with a battery;
   a function generator connected to the battery and producing an output signal as a function of the terminal voltage of the battery immediately upon engagement of the load;
   a timing circuit connected to the battery for establishing a test time period;
   comparison means connected to said function generator for comparing the value of said function at the end of said test time period with preselected voltage references, the comparisons determining the condition of said battery; and
   display means connected to said comparison means for indicating the condition of said battery.

2. The battery condition monitoring device as recited in claim 1 wherein said function generator comprises a differentiating circuit.

3. The battery condition monitoring device as recited in claim 1 wherein said function generator comprises an integrating circuit.

4. The battery condition monitoring device as recited in claim 1 wherein said preselected voltage references are supplied via a voltage divider network.

5. The battery condition monitoring device as recited in claim 4 wherein said voltage divider network is temperature compensated.

6. The battery condition monitoring devices recited in claim 1 which further includes display timing means connected to said display means for establishing a fixed period of operation of said display means.

7. The battery condition monitoring device as recited in claim 1 wherein said timing circuit comprises a counter connected to the battery and enabled upon the terminal voltage of said battery dropping to a particular level.

8. A battery condition determination device, comprising:
   an external load switchably interconnected to the battery;
   first circuit means connected to the battery for creating an output voltage as a function of the terminal voltage of the battery under said external load;
   comparator means connected to said first circuit means and receiving said output voltage and comparing the same against fixed reference levels;
   display means connected to said comparator means for indicating the comparison between said output voltage and said reference levels; and
   timing means interconnected between said display means and said battery for enabling said display means after a fixed duration of time.

9. The battery condition determination device as recited in claim 8 wherein said timing means is further connected to the battery and is operative to establish a test period of fixed duration after the battery terminal voltage drops below a particular level.

10. The battery condition determination device as recited in claim 9 wherein said timing means includes a clock circuit connected to a counter, said counter being connected to said display means.

11. The battery condition determination device as recited in claim 8 wherein said first circuit means comprises a differentiator circuit.

12. The battery condition determination device as recited in claim 8 wherein said first circuit means comprises an integrating circuit.

13. The battery condition determination device as recited in claim 8 wherein said display means further includes a timer for fixing the period of operation of said display means.

* * * * *